United States Patent
Wiatrowski et al.

[11] Patent Number: 5,806,002
[45] Date of Patent: Sep. 8, 1998

[54] METHOD OF SCANNING USING RESOURCE ANALYSIS

[75] Inventors: David Wiatrowski, Gurnee; David Mills, Hanover Park, both of Ill.

[73] Assignee: Motorola, Inc., Schaumburg, Ill.

[21] Appl. No.: 742,070

[22] Filed: Oct. 31, 1996

[51] Int. Cl.⁶ ..................................................... H04B 1/18
[52] U.S. Cl. ...................... 455/512; 455/515; 455/161.2; 455/166.2
[58] Field of Search ................................. 455/32.1, 38.1, 455/507, 509, 510, 512, 513, 515, 516, 517, 518, 519, 161.1, 161.2, 161.3, 166.1, 166.2, 186.1, 113, 114, 115, 117, 119, 120; 340/825.04, 825.44

[56] References Cited

U.S. PATENT DOCUMENTS

4,716,407  12/1987  Borras et al. ............................ 455/512
5,214,790   5/1993  Kozlowski et al. .................. 455/166.2
5,257,416  10/1993  Cannon ................................. 455/166.2

*Primary Examiner*—Thanh Cong Le
*Attorney, Agent, or Firm*—Susan L. Lukasik

[57] ABSTRACT

In a communication unit (105) in which a priority scan occurs, wherein priority scan comprises automatically scanning, while the communication unit (105) is unmuted to a non-priority communication resource having a first frequency, at least one priority communication resource having a second frequency, a method of scanning using resource analysis comprises the steps of receiving (301) a signal on the non-priority communication resource and unmuting the communication unit in response to the signal. It is determined (307) if the first frequency is substantially identical to the second frequency. If the first frequency is substantially identical to the second frequency, the priority scan is inhibited (311).

20 Claims, 3 Drawing Sheets

METHOD OF SCANNING USING RESOURCE ANALYSIS

FIELD OF THE INVENTION

This invention relates to radio frequency (RF) communication systems, including but not limited to scanning of radio frequencies in RF communication systems.

BACKGROUND OF THE INVENTION

Currently, conventional radio systems and trunking radio systems exist. Each system offers its users the ability to scan various talkgroups and radio frequency communication resources.

In a typical conventional system, a communication unit scans between different frequencies in order to listen to, inter alia, the various talkgroup activity in the unit's scan list, an internally stored list of talkgroup/conventional frequencies.

In a scan list, typically a list of channels accompanied by a talkgroup, appear levels of receive priority assigned by the user of the receiving communication unit. When the communication unit is not actively on a call, the scan list is used to provide an order of channels that is followed when the communication unit performs its scanning of the scan list. If activity is detected on a non-priority channel, the communication unit stops to monitor the call on the non-priority channel. During the non-priority call, scanning of priority channels, but not non-priority channels, from the scanning list continues at predetermined intervals, in a method known as priority scanning. If a call comes in on a priority channel, the communication unit will tune to that channel and stay with that channel until the completion of the priority call. When a communication unit checks a higher priority channel for call activity during a non-priority call, the communication unit experiences small holes in the audio of the non-priority call, for example, 50 milliseconds in length every 500 milliseconds (50 milliseconds being the length of the hole and 500 milliseconds being the length of the predetermined interval). In some systems, priority scanning with two or more priority channels occurs, using a slightly varied scanning algorithm. For example, when activity is detected on a lower priority channel, periodic scanning may take place on a higher priority channel.

In a typical trunking system, a communication unit locks on to a control channel, and thus monitors the call assignments for a match to its list of groups to be scanned. If a match occurs, the unit follows the instructions in that call assignment and listens to the traffic on the trunk channels. In addition, groups to be scanned are assigned multiple levels of receive priority by the scanning communication unit. Along with the priority monitor algorithm, this method of scanning allows the scanning unit to hear higher priority traffic. While listening to a lower priority call, the communication unit will be decoding special voice channel signalling from the trunked resource controller looking for an announcement that a higher priority group has subsequently started a call on another channel. If this new group is in the unit scan list and is in a higher priority, it will leave the voice channel of the current call in favor of returning to the control channel. Once there, the communication unit will determine the actual assigned voice channel of the higher priority call and go to the call as a receiver. This priority monitor function is describe in Jaime Andres Borras, (Trunked Communication System True Priority Channel Scan,) U.S. Pat. No. 4,716,407, issued Dec. 29, 1987, which patent is hereby incorporated herein by reference.

Because the audio holes caused by scanning can be distracting and even annoying to a listener, it is desired to minimize the audio holes caused by scanning. In addition, because of the potentially large number of channels/frequencies/modulation types that may be scanned, a more efficient method of scanning the multiplicity of channels is desired.

Accordingly there is a need for an improved scanning algorithm.

DESCRIPTION OF A PREFERRED EMBODIMENT

The following describes a method of inhibiting a priority scan when a non-priority communication is received. The method includes analyzing one or more communication resource (channel) parameters and characteristics, including frequency, bandwidth, modulation detection capability, talkgroup affiliation, and so forth. Communication resources include talkaround channels, frequency pairs, time slots, and other communication media.

In a communication unit in which a priority scan occurs, wherein priority scan comprises automatically scanning, while the communication unit is unmuted to a non-priority communication resource having a first frequency, at least one priority communication resource having a second frequency, a method of scanning using resource analysis comprises the steps of receiving a signal on the non-priority communication resource and unmuting the communication unit in response to the signal. It is determined if the first frequency is substantially identical to the second frequency. If the first frequency is substantially identical to the second frequency, the priority scan is inhibited. The communication unit may wait for an end of a scan interval before completing the determining and inhibiting steps.

In an alternate embodiment of the present invention, in a communication unit in which a priority scan occurs, wherein priority scan comprises automatically scanning, while the communication unit is unmuted to a non-priority communication resource having a first frequency, at least one priority communication resource having a second frequency, a method of scanning using resource analysis comprises the steps of receiving a signal on the non-priority communication resource and unmuting the communication unit. It is determined if the first frequency is substantially identical to the second frequency. A first talkgroup affiliated with the non-priority communication resource and a second talkgroup affiliated with the at least one priority communication resource are determined. If the first frequency is substantially identical to the second frequency, and the first talkgroup is identical to the second talkgroup, the priority scan is inhibited for as long as the signal lasts. In addition, the signal may be treated as a priority signal.

In another alternate embodiment of the present invention, in a communication unit in which a priority scan occurs, wherein priority scan comprises automatically scanning, while the communication unit is unmuted to a non-priority communication resource having a first frequency, at least one priority communication resource having a second frequency, a method of scanning using resource analysis comprises the steps of receiving a signal on the non-priority communication resource and unmuting the communication unit. It is determined if the first frequency is substantially identical to the second frequency. A first squelch rule assigned to the non-priority communication resource and a second squelch rule assigned to the at least one priority communication resource are determined. The first squelch rule is compared to the second squelch rule. If the first frequency is substantially identical to the second frequency, and if the second squelch rule is equally restrictive as or less restrictive than the first squelch rule, the priority scan is inhibited. In addition, the signal may be treated as a priority signal.

Additional features of these embodiments include, if the first frequency is different from the second frequency, the priority scan is continued. The step of determining may further comprise the step of determining if the non-priority communication resource and the at least one priority communication resource have a common network identifier. Further, a first squelch rule assigned to the non-priority communication resource and a second squelch rule assigned to the at least one priority communication resource may be determined, and the first squelch rule is compared to the second squelch rule. If the first frequency is substantially identical to the second frequency, and if the second squelch rule is equally restrictive as or less restrictive than the first squelch rule, the priority scan is inhibited. In addition, the priority scan may be performed from a scan list in which a plurality of channels is scanned in an order wherein all of the plurality of channels having a substantially identical frequency are scanned consecutively before a channel is scanned having a different frequency. In addition, the signal may be treated as a priority signal.

Figure 1:
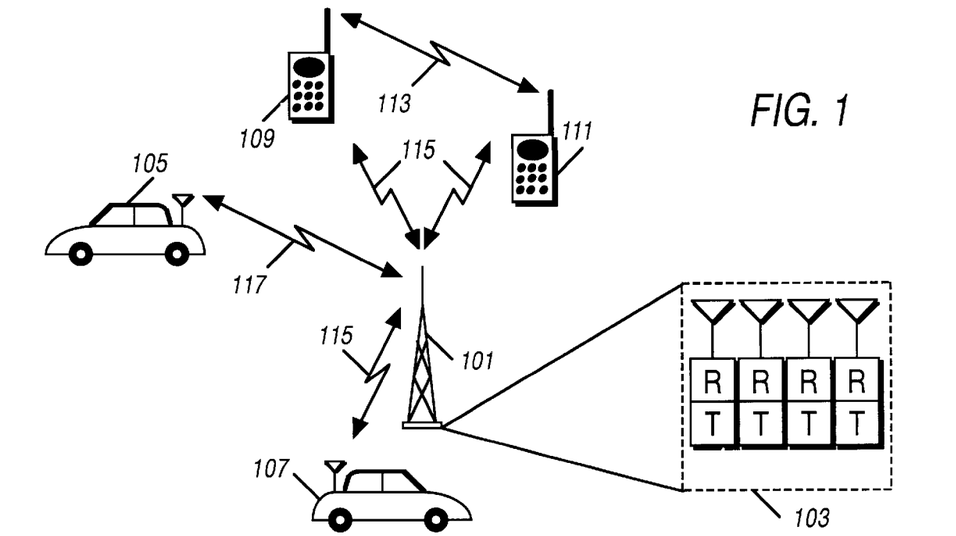
FIG. 1 is a block diagram of a communication system having multiple communication units in accordance with the invention.

A block diagram of a communication system having multiple communication units as shown in FIG. 1. A repeater or base station site 101 having multiple repeaters or base stations 103 communicates between a plurality of communication units 105, 107, 109, and 111. The communication units 105, 107, 109, and 111 may be fixed, portable, or mobile communication units and may communicate on a multiplicity of communication resources 113, 115, and 117 sourced by the bases stations 103 at the base site 101. The communications may take place between one or more talkgroups, as one-to-one communications, as dispatch communications (i.e., one-to-many), as telephone interconnection communications, and so forth. These communication resources may be talk-around channels, frequency pairs, time division multiplex (TDM) slots, and other types of communication resources. When a user has a communication unit 105 that is capable of receiving two or more communication channels, the user may program his or her communication unit 105 to receive one or more of these channels in one or more scanning modes.

Many ways of scanning communication resources exist. For example, a communication unit may switch between channels listed on a scan list and programmed into the radio to look for activity on any of the channels that are listed in the scan list. A first method of scanning, which takes place when there is no activity on any channel, is normal or conventional scanning, when each channel listed in the normal scan list is tuned to in turn for a fixed time interval to search for communications activity. If no activity is detected, the next channel on the scan list is then scanned, and if no activity is detected, the next channel is scanned in the same way until activity is detected on a channel in the scan list. Although only four channels are shown in FIG. 2A and 6 channels are shown in FIG. 2B, such a scanning process may be successfully implemented on many more channels.

Figure 2A:
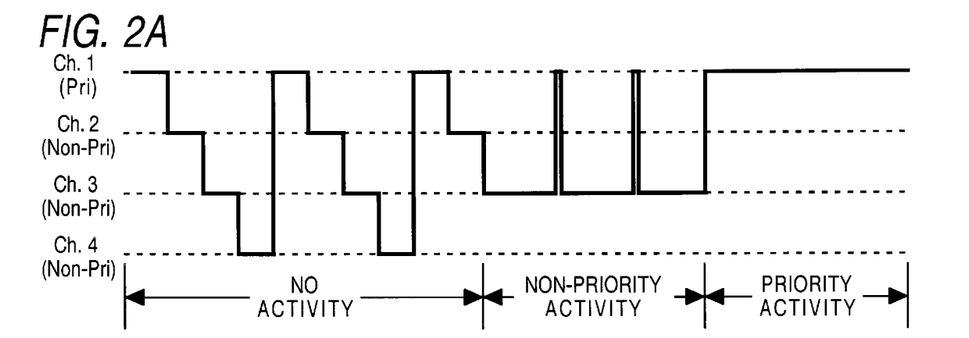
FIG. 2A and 2B are timing diagrams showing a scanning algorithm and illustrating a currently received channel in accordance with the invention.

A timing diagram showing priority scanning is shown in FIG. 2A. The left-most section of the timing diagram depicts a "no activity" time interval, during which time no activity is detected on any of the four channels of the communication unit 105. During the "no activity" period, the communication unit 105 switches between channel 1 (a priority channel), channel 2 (a non-priority channel), channel 3 (a non-priority channel), and channel 4 (a non-priority channel) in turn until activity is detected. The particular scan sequences shown are merely illustrative, and may be configured to suit the particular needs of a user. In the preferred embodiment, the scanning sequence in the "no activity" time interval when one priority channel is present is: Channel 1, Channel 2, Channel 1, Channel 3, Channel 1, Channel 4, Channel 1, Channel 2, Channel 1, Channel 3, Channel 1, Channel 4, and so forth until activity is detected (not shown in the diagram).

In the middle section of the timing diagram, activity is detected on non-priority channel 3. A second method of scanning, often referred to as priority scanning, takes place when activity is detected on a non-priority channel. During priority scanning, the priority channel is scanned at a periodic scanning interval. In the preferred embodiment, scanning intervals are 500 milliseconds apart and scanning typically consumes approximately 50 milliseconds of time. During the 50 milliseconds of scanning, a hole in the audio is heard in the non-priority channel's signal. If activity is detected on a priority channel during the scan, as shown in the "priority activity" section of the timing diagram, the radio tunes to the priority channel, a priority alert tone is optionally generated (900 Hz tone of 75 msec duration), and a priority alert visual indicator, such as a flashing (or solid) dot, icon, or LED, is optionally presented to the user by the communication unit 105. Scanning is then discontinued, i.e., scanning is inhibited in the communication unit 105, until the priority activity or call is completed. In addition, the particular scan sequences shown are merely illustrative, and may be configured to suit the particular needs of a user. In addition, while the communication unit 105 is operating in the "no activity" period, priority activity may be detected on Channel 1, in which case the "non-priority activity" period will not take place and no priority scanning would occur.

Figure 2B:
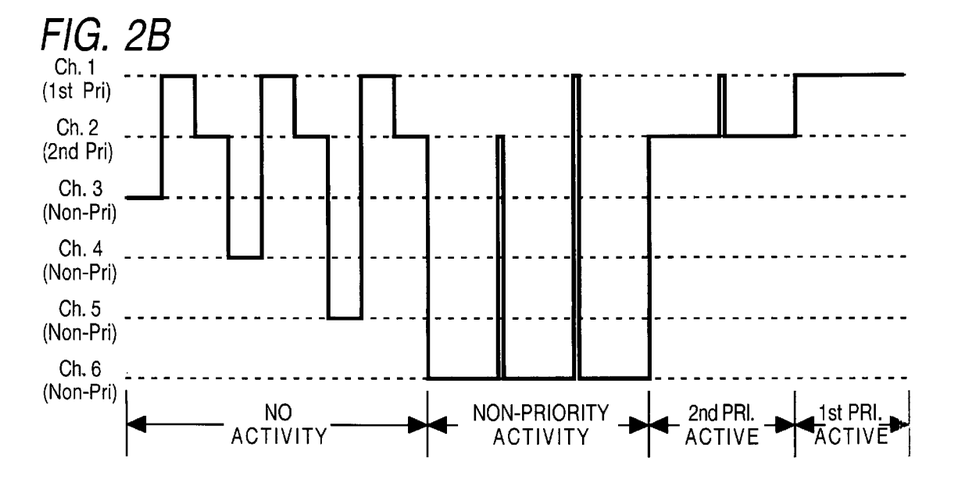

A timing diagram showing priority scanning with two priority channels is shown in FIG. 2B. The left-most section of the timing diagram depicts a "no activity" time interval, during which time no activity is detected on any of the six channels of the communication unit 105. During the "no activity" period, the communication unit 105 switches between channel 1 (a first or higher priority channel), channel 2 (a second or lower priority channel), channel 3 (a non-priority channel), channel 4 (a non-priority channel), channel 5 (a non-priority channel), and channel 6 (a non-priority channel) in a predetermined sequence until activity is detected. In the preferred embodiment, during the "no activity" period, the communication unit 105 scans both priority channels between scans of non-priority channels, as shown in FIG. 2B, in the sequence: Channel 1, Channel 2, Channel 3, Channel 1, Channel 2, Channel 4, Channel 1, Channel 2, Channel 5, Channel 1, Channel 2, Channel 6, and so forth.

In the second section of the timing diagram of FIG. 2B, activity is detected on non-priority channel 6. A different method of priority scanning takes place when activity is detected on a non-priority channel when multiple priority channels are present. During multiple priority channel priority scanning, the priority channels are each scanned at a periodic scanning interval. In the preferred embodiment, scanning intervals are 500 milliseconds apart and scanning typically consumes approximately 50 milliseconds of time. During the 50 milliseconds of scanning, a hole in the audio is heard in the non-priority channel's signal. If activity is detected on a second or lower priority channel during the scan, as shown in the "2nd PRI. ACTIVE" section of the timing diagram, the radio tunes to the second or lower priority channel, here channel 2, and continues to scan only the first or higher priority channel, channel 1. If activity is detected on the first or higher priority channel during this scan, as shown in the "1st PRI. ACTIVE" section of the timing diagram, the radio tunes to the first or higher priority channel, a priority alert tone is generated (900 Hz tone of 75 msec duration) in the preferred embodiment, and a priority alert visual indicator, such as a flashing (or solid) dot, icon, or LED, is presented to the user by the communication unit 105. Scanning is then discontinued, i.e., scanning is inhibited in the communication unit 105 until the first or higher priority activity or call is completed. Although only six channels are shown in FIG. 2B, such a scanning process may be successfully implemented on many more channels. In addition, the particular scan sequences shown are merely illustrative, and may be configured to suit the particular needs of a user. Further, while the communication unit 105 is operating in the "no activity" period, first priority activity may be detected on Channel 1, in which case the "non-priority activity" period will not take place and no priority scanning would occur. Similarly, while the communication unit 105 is operating in the "no activity" period, second priority activity may be detected on Channel 2, in which case the "non-priority activity" period will not take place and priority scanning would occur.

The present invention provides a method of inhibiting priority scanning during the non-priority activity or 2nd priority active situations, such as those shown in FIG. 2A and FIG. 2B.

Throughout the description and drawing figures, a designation or suffix of "1" is used to refer to a characteristic of the non-priority channel on which a signal is received (e.g., step 301 of FIG. 3) and a designation or suffix of "2" is used to denote a priority channel characteristic when there is only one priority channel present in the scanning list. For example, F1 refers to the frequency of a non-priority channel, and BW2 refers to the bandwidth of a priority channel. The present application is also applicable to a system in which multiple priority channels are scanned. In this instance, a designation or suffix of "1" is used to refer to a characteristic of the non-priority channel or a second or lower priority channel on which a signal is received (e.g., step 301 of FIG. 3) and a designation or suffix of "2" is used to denote a priority channel characteristic of the priority channel for which scanning may be inhibited. The description of FIG. 3 and FIG. 4 is described with respect to the single priority channel case, although the same methods may be applied when multiple priority channels are present to inhibit one or more priority channel scans for a received non-priority signal and to inhibit one or more higher priority channel scans for a received priority signal.

By inhibiting the scanning process when it is unnecessary or not advantageous to scan based on the nature of the received signal and the channel to be scanned, audio holes may be eliminated from received signals in certain circumstances. The flowcharts of FIG. 3 and FIG. 4 depict a manner for determining when to inhibit and when to continue priority scanning.

Figure 3:
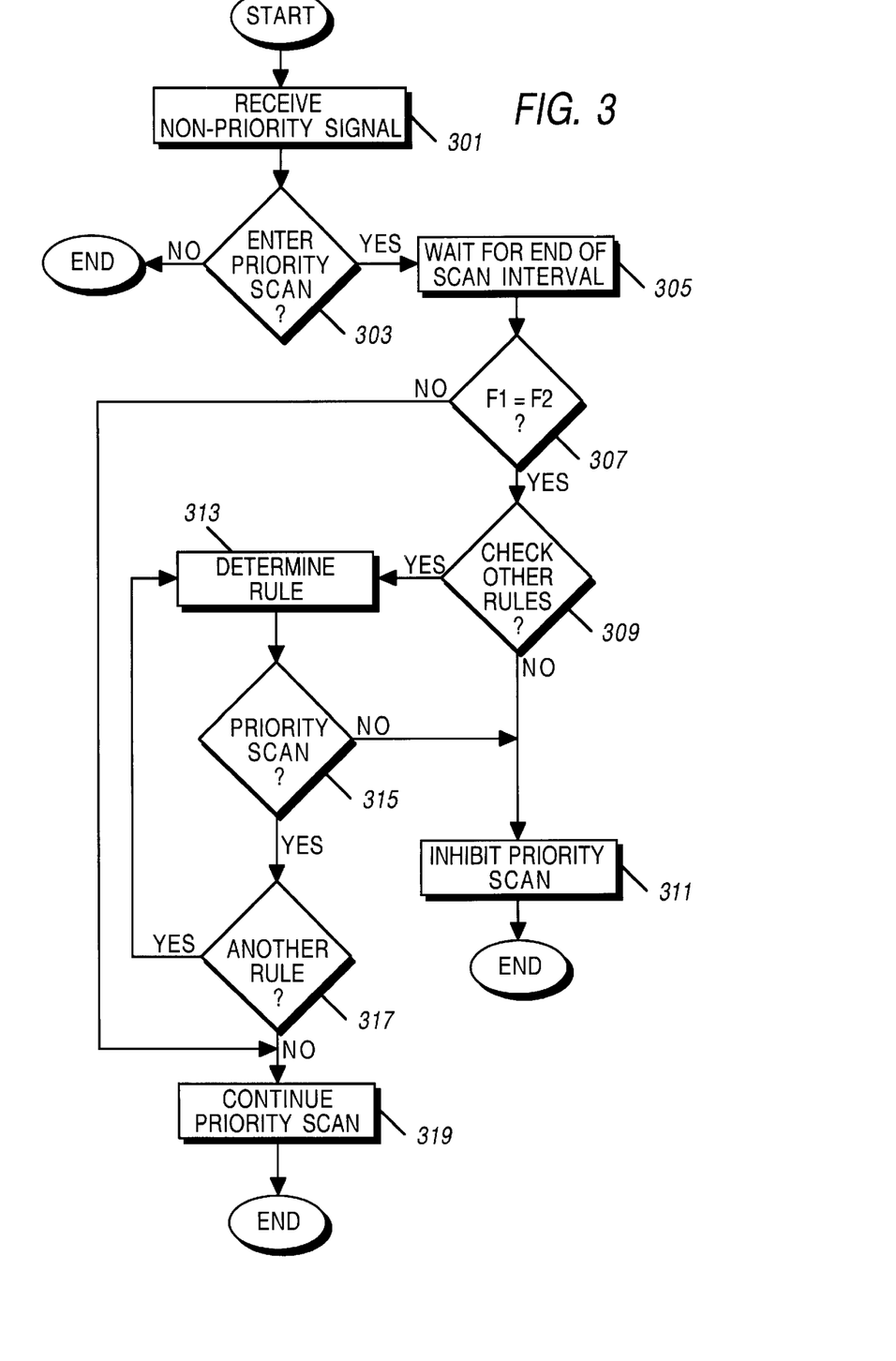
FIG. 3 is a flowchart showing a method of inhibiting a priority scan in accordance with the invention.
Figures 4, 5:
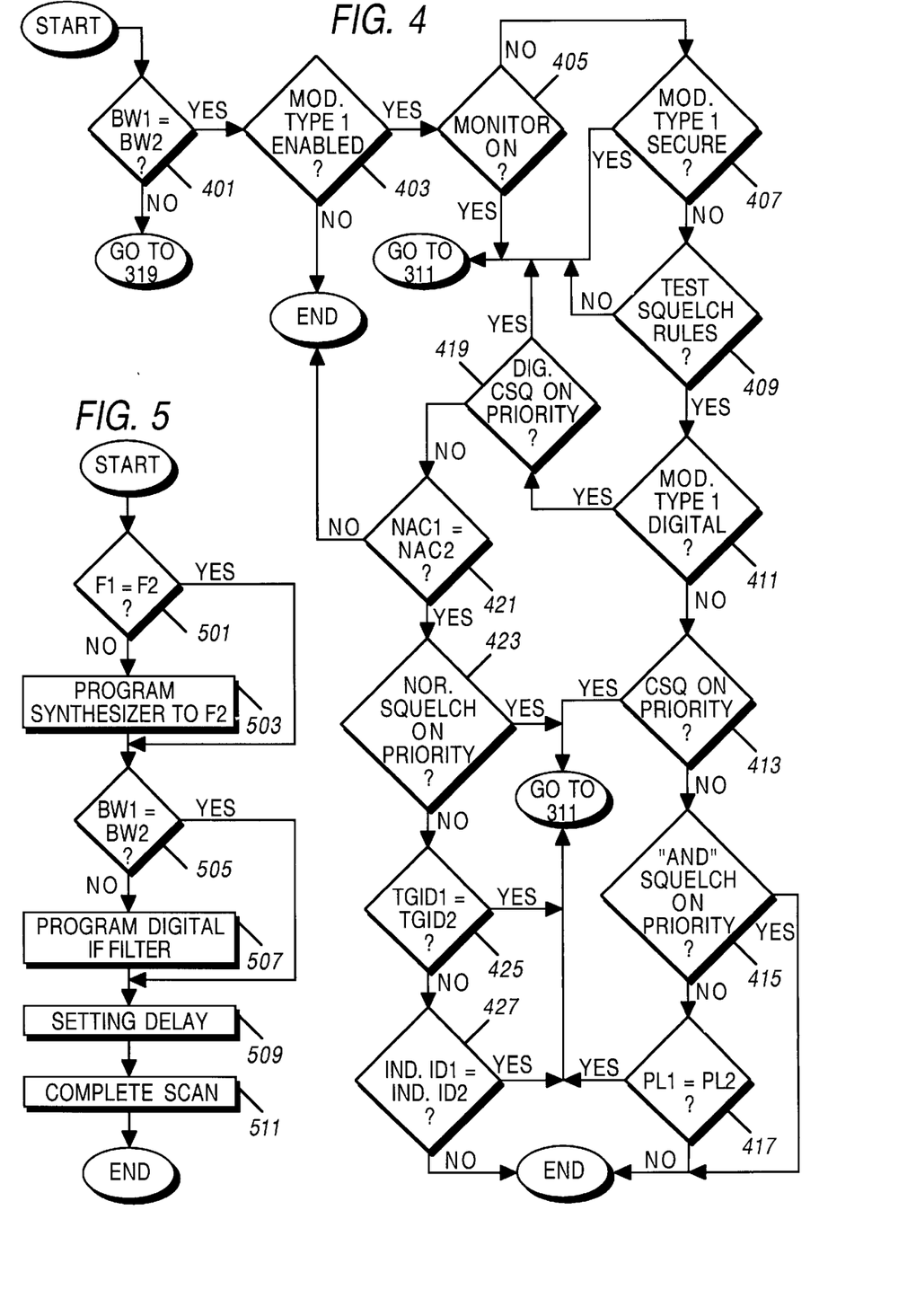
FIG. 4 is a flowchart showing a method of testing rules in order to inhibit a priority scan in accordance with the invention.
FIG. 5 is a flowchart showing a method of scanning in accordance with the invention.

A flowchart depicting a method of determining when to inhibit scanning is shown in FIG. 3. In the preferred embodiment, the flowchart of FIG. 3 would be performed for each priority channel in the communication unit's 105 scan list. At step 301, a non-priority signal is received and the communication unit is unmuted in order to render the non-priority signal audible to a user. For example, referring to the timing diagram of FIG. 2, such activity would fall in the "non-priority activity" section in the middle of the timing diagram. At step 303, it is determined whether priority scan will be entered. Such a determination may be made by, for example, checking for priority scan as an option in the radio, by checking to see if priority scan is enabled by the user of the communication unit, and so forth. If it is determined that priority scan will not be entered at step 303, the process ends. If it is determined that priority scan will be entered at step 303, the process continues with step 305. At step 305, the communication unit may wait for the end of a scan interval. In the preferred embodiment, scanning intervals occur every 500 milliseconds. If it is desired for the communication unit not to wait for the end of a scan interval, the process proceeds immediately from step 303 to step 307. It is also possible to make the determinations of steps 307, 309, and so forth at the time the scan list is programmed into the communication unit 105, in which case a look-up table is consulted when priority scanning takes place.

At step 307, it is determined if the frequency F1 of the non-priority channel is substantially identical to the frequency F2 of the priority channel. The frequency of a first channel is considered substantially identical to the frequency of a second channel when a signal may be received on either channel without the need to reprogram a frequency synthesizer or otherwise adjust the tuning of the radio receiver of a communication unit. If the frequencies are not substantially identical at step 307, the process continues with step 319, where priority scan is continued. As an added feature, the scan list for the priority scan may be arranged such that the plurality of channels associated with the communication unit 105 is scanned in an order wherein all of the plurality of channels having a substantially identical frequency are scanned consecutively before a channel is scanned having a different frequency. Thus, scanning is performed more quickly and the audio holes resulting from the scanning process are shorter because the frequency synthesizer setting and settling time need not be a delay because the communication unit is already set to that frequency. In addition, the non-priority or conventional (normal scanning) as takes place in the "no activity" section of the timing diagram of FIG. 2 may also benefit from the technique of the arranging the order of scanning of channels such that the plurality of channels associated with the communication unit 105 is scanned in an order wherein all of the plurality of channels having a substantially identical frequency are scanned consecutively before a channel is scanned having a different frequency.

If the frequencies are substantially identical at step 307, the process continues with step 309, where it is determined if other rules will be checked to determine if scanning may be inhibited. These other rules include determining talkgroup IDs, squelch rules, bandwidths, detectability of modulation type, and so forth. Application of these rules is shown in the flowchart of FIG. 4. If these other rules are not to be checked at step 309, the process continues with step 311, where the non-priority signal is treated as a priority signal (if such treatment is desired), and scanning is inhibited for the remainder of the received signal. In the preferred embodiment treating the received signal (either a non-priority signal or a lower priority signal) as a priority signal includes generating a priority alert tone and providing a priority alert visual indicator, and the process ends. Inhibiting scanning, i.e., sampling, when the priority channel and the non-priority channel simply have a substantially identical frequency is particularly helpful when the two channels have basically the same set-up in the communication unit 105 because a priority communication on the same frequency would likely interfere with the non-priority signal, at which the communication unit 105 is already tuned.

If at step 309, other rules are to be determined, the process continues with step 313, where it is determined what rule will be used to determine if scanning will be inhibited. At step 315, the rule is analyzed for particulars in determining whether or not inhibiting the scan is appropriate for the particular channels. If the results of the determination at step 315 indicate that priority scan should not be continued, the process continues with step 311. Steps 313 and 315 of FIG. 3 may be replaced by the entire flowchart of FIG. 4 or the rules of FIG. 4 that are desired for use in a particular communication unit. If the results of the determination at step 315 indicate that priority scan should be continued the process continues with step 317. At step 317, it is determined if another rule for determining if scan should be discontinued should be analyzed, and if so the process continues with step 313, otherwise the process continues with step 319.

The flowchart of FIG. 4 shows a number of rules that may be tested to determine if priority scanning may be inhibited. Although all the tests are shown in a serial manner in the flowchart of FIG. 4, all the tests need not be completed if it is so desired for the particular communication unit. For example, FIG. 4 describes testing bandwidth, modulation enablement, monitor enablement, detectability of modulation type, and squelch rules. If it is desired to avoid testing any of these rules, that particular rule may simply be removed from the flowchart, and replaced with a direct line from the previous rule to the subsequent rule. For example, if it is desired not to test for detectability of modulation type, FIG. 4 would contain all blocks except block 407, and the "no" branch of step 405 would enter directly into block 409. As another example, if it is desired not to test the squelch rules, FIG. 4 would contain only blocks 401, 403, 405, and 407, and the "no" branch of step 407 would end (inhibit) the scanning process.

At step 401, it is determined if the bandwidth BW1 of the non-priority channel is substantially identical to the bandwidth BW2 of the priority channel. The bandwidth of a first channel is considered substantially identical to the bandwidth of a second channel when a signal may be received on either the first or second channel with only the need to reprogram a frequency synthesizer and without the need to alter the IF filter characteristics or otherwise adjust the tuning of the radio receiver of a communication unit. For example, the bandwidth of a communication channel may be 25 kHz, 12.5 kHz, or 6.25 kHz. Bandwidth may be measured as half-power bandwidth, equivalent rectangular or noise equivalent bandwidth, null-to-null bandwidth, fractional power containment bandwidth, bounded power spectral density bandwidth, absolute bandwidth, and so forth. If the bandwidth of the channels is not substantially identical, the process continues with step 319 of FIG. 3, where priority scan continues. If at step 401, the bandwidth of the non-priority channel BW1 is substantially identical to the bandwidth of the priority channel BW2, the process continues with step 403.

At step 403, it is determined if the modulation type of the non-priority signal is enabled on the priority channel, i.e., the modulation type of the non-priority signal is compared to the characteristics allowed on the priority channel. If priority mode is not enabled at step 403, the scanning or sampling process is inhibited for the remainder of the received signal. If priority mode is enabled on the non-priority channel at step 403, the process continues with step 405. At step 405, it is determined if monitor mode is on. In the preferred embodiment, monitor mode defeats the squelch rule requirements for channel qualification, where channel qualification for analog signals is simply carrier squelch detection (no private line or PL and no digital private line or DPL) and for digital signals is sync detection (no network identifier or NID) or digital carrier squelch (CSQ). If monitor is determined to be on at step 405, the process continues with step 311 of FIG. 3. If the monitor is not on at step 405, the process continues with step 407, where it is determined if the modulation type of the non-priority channel is undetectable.

The detectability test of step 407 is used if the communication unit 105 is for some reason unable to detect a certain type of modulation or simultaneously process two different types of signals due to processing power limitations. For example, in the preferred embodiment, a NRZ (nonreturn-to-zero), N-level, gaussian impulse response filtered, square pulse symbol, such as a 12 kbit digitally encrypted signal, takes more computing power to detect or process than most other signals. The communication unit 105 may need to process other information simultaneously with handling such a signal, and thereby exceed its limit on processing power, rendering one of the processes non-functional. When a channel is associated with such a modulation type, it is assumed to prefer to inhibit scanning of the modulation type and treat the current non-priority channel as a priority signal (if such treatment is desired) and inhibit the scans of the undetectable or process power-intensive modulation type. For example, if the communication unit 105 has a total processing ability or power of 2X, and 1X of the power is needed to process the non-priority or 2nd (lower) priority signal, and the (1st) priority signal takes 1.5X of the unit's power, the unit 105 would not have enough power to simultaneously process both the lower priority and higher priority signals, because 2.5X total power is required, which is beyond the unit's capability of 2X. If at step 407, the non-priority channel is undetectable, the process continues with step 311 of FIG. 3, otherwise the process continues with step 409.

A communication unit typically has multiple channels assigned to it. These channels may tune to the same or different receive or transmit frequencies. Different channels may be assigned the same frequencies, but the difference between the channels may be the squelch rules, the talkgroup, the modulation type, encryption option (i.e., secure or not), and so forth associated with the channel. For example, a communication unit may have only two frequencies but may have 16 or more channels assigned, as show in the following example table.

|  | Rx Freq. | Tx Freq. | Rx Mod. Type | Tx Mod. Type | Analog Squelch Rule | Digital Squelch Rule | Talk group |
|---|---|---|---|---|---|---|---|
| Ch. 1 | A | B | Analog | Analog | CSQ | N/A | None |
| Ch. 2 | A | B | Digital | Digital | N/A | Digital CSQ | None |
| Ch. 3 | A | B | Analog | Analog | PL | N/A | None |
| Ch. 4 | A | B | Analog | Analog | DPL | N/A | None |
| Ch. 5 | A | B | Digital | Digital | N/A | Normal | None |
| Ch. 6 | A | B | Analog | Analog | Data-OR | N/A | TG1 |
| Ch. 7 | A | B | Digital | Digital | N/A | Selective | TG1 |
| Ch. 8 | A | B | Analog | Analog | Data-AND | N/A | TG2 |
| Ch. 9 | A | B | Digital | Digital | N/A | Data-AND | TG2 |
| Ch. 10 | A | B | Analog/ Digital | Analog | PL | Normal | None None |
| Ch. 11 | A | B | Analog/ Digital | Digital | PL | Normal | None None |
| Ch. 12 | A | B | Analog/ Digital | Analog | Data-OR | Selective | TG3 TG3 |
| Ch. 13 | A | B | Analog/ Digital | Digital | Data-OR | Selective | TG3 TG3 |
| Ch. 14 | A | B | Analog/ Digital | Analog | Data-OR | Selective | TG4 TG4 |
| Ch. 15 | A | B | Analog/ Digital | Digital | Data-OR | Selective | TG4 TG4 |
| Ch. 16 | A | B | Analog/ 12 kbps | User Selects | PL | N/A | None |

The preceding table is mereley illustrative of channel configurations and does not provide an exhaustive list of possible channel configurations.

In addition, each channel may be assigned a set of squelch rules. Carrier squelch (CSQ), private line (PL), digital private line (DPL), data-OR-squelch, and data-AND-squelch may be used as squelch rules for analog channels. In the preferred embodiment, these squelch rules are described as follows. Private line requires detection of a valid sub-audible tone in the receiver to allow analog audio to be presented to the user. Digital private line requires detection of a valid 23-bit low speed binary signal (134.4 bps) in the receiver to allow analog audio to be presented to the user. Data-OR-squelch requires either detection of a valid sub-band signal, such as PL or DPL, or detection of a valid high speed data packet addressed to the radio, such as MDC1200, to allow analog audio to be presented to the user. Data-AND-squelch requires both detection of a valid sub-band signal, such as PL or DPL, and detection of a valid high speed data packet addressed to the radio, such as MDC1200, to allow analog audio to be presented to the user. Valid, in the preferred embodiment, refers to a match of the signal with the appropriate data stored in the communication unit's codeplug. Digital channels may use squelch rules such as digital carrier squelch (digital CSQ), normal squelch, selective squelch, and data-AND-squelch. In the preferred embodiment, digital CSQ only requires detection of a valid frame sync signal (and data unit ID portion of the network ID) to allow audio to be presented to the user; and data-AND-squelch requires detection of a valid frame sync, NAC, talkgroup ID or individual ID match, and a selective call indication (i.e., the selective call link control frame is used to transport the link information) to allow audio to be presented to the user. As defined by APCO-25, normal squelch requires detection of a valid frame sync and NAC (network access code) signals to allow audio to be presented to the user; and selective squelch requires detection of a valid frame sync, NAC, and talkgroup ID or individual ID match to allow audio to be presented to the user. Talkgroup ID or individual ID match refers to a match between the received talkgroup ID or received individual ID and the respective value stored in the communication unit's codeplug.

At step 409, it is determined if the squelch rules will be tested to determine if priority scan will be inhibited. Generally, if the squelch rule of the priority channel is equally restrictive as or less restrictive than the squelch rule of the non-priority channel, scanning is inhibited and the non-priority channel is treated as a priority channel (if such treatment is desired). If it is desired to test the squelch rules at step 409, the process continues with step 411, otherwise the process continues with step 311. At step 411, it is determined if the non-priority modulation type is digital. For example, the non-priority modulation type may be APCO 25 standard digital channels in the preferred embodiment. If the non-priority channel is a digital channel at step 411, the process continues with step 419, otherwise the process continues with step 413. At step 413, it is determined if the priority channel has carrier squelch (CSQ) as its squelch rule. If the priority channel has CSQ as its squelch rule the process continues with step 311 of FIG. 3. If CSQ is not the priority channel squelch rule, the process continues with step 415, where it is determined if AND squelch is the rule for the priority channel. If AND squelch is on the priority channel at step 415, the scanning or sampling process is inhibited for the remainder of the received signal. If AND squelch is not on the priority channel at step 415, the process continues with step 417, where the private line is tested. If the private line rule of the non-priority channel is the same as the private line rule of the priority channel at step 417, the process continues with step 311 of FIG. 3, otherwise the scanning or sampling process is inhibited for the remainder of the received signal.

If at step 411, the modulation type of the non-priority channel is digital, the process continues with step 419, where it is determined if the squelch rule of the priority channel is Digital CSQ. If the squelch rule of the priority channel is Digital CSQ, the process continues with step 311, otherwise the process continues with step 421. At step 421, it is determined if the Network Access Code (NAC) of the non-priority channel is the same as the NAC of the priority channel. In the preferred embodiment, a network identifier encodes 16 bits of information. The 16 bits of information are separated into a 12-bit NAC and a 4-bit data unit ID. The following is a list of data unit IDs in accord with the preferred embodiment: 1) header data unit; 2) terminator without subsequent link control; 3) logical link data unit 1;4) trunking signaling unit; 5) logical link data unit 2;6) packet data unit; and 7) terminator with subsequent link control. In the preferred embodiment, it is not necessary to match the data unit ID for an NAC match at step 421. The NAC is a digital signal that is analogous to a PL tone in an analog system. In the preferred embodiment, a 48-bit frame sync word (5575F5FF77FF in the preferred embodiment) is transmitted immediately before the network identifier. The frame sync word must be detected before attempting to match the network identifier. If the NACs are identical, or the same, at step 421, the process continues with step 423, otherwise the process ends. At step 423, it is determined if the priority channel has a normal squelch rule, as described above. If a normal squelch rule is found on the priority channel at step 423, the process continues with step 311 of FIG. 3, otherwise the process continues with step 425. At step 425, it is determined if the talkgroup ID (TGID) of the non-priority channel is identical to the talkgroup ID of the priority channel. If these IDs are identical at step 425, the process continues with step 311 of FIG. 3. If the talkgroup IDs are not identical, the process continues with step 427 where it is determined if the individual ID of the first channel is identical to the individual ID of the priority channel. If the IDs are identical, the process continues with step 311 of FIG. 3 otherwise the scanning or sampling process is inhibited for the remainder of the received signal.

A flowchart describing a general method of scanning is shown in the flowchart of FIG. 5. At step 501, it is determined if the frequency of the current channel (the non-priority or 2nd priority channel of step 301 of FIG. 3) is substantially identical to the frequency of the priority channel. If the frequencies are substantially identical, the process continues with step 505. If the frequencies are different the process continues with step 503, where the frequency synthesizer is programmed to the frequency of the priority channel. At step 505, it is determined if the bandwidth of the current channel (the non-priority or 2nd priority channel of step 301 of FIG. 3) is substantially identical to the bandwidth of the priority channel. If the bandwidths are substantially identical, the process continues with step 509. If the bandwidths are different the process continues with step 507, where the digital IF (intermediate frequency) filter is programmed to the appropriate setting. At step 509, a delay is endured to allow for setting of the filter and synthesizer. At step 511 the scan is completed by determining if there is activity on the particular channel, and the process ends.

Because the holes in the audio in the non-priority channel are undesirable, the present method for eliminating scanning that produces audio holes in audio signals under certain circumstances is beneficial. Incorporating the present method of scanning provides a more efficient scanner that uses resource analysis to group different channel personalities with identical receive frequencies and channel bandwidths so that they may be scanned sequentially without having to retune the communication unit's synthesizer and IF filter between channel personalities, a process that requires a significant amount of time. This process allows many more communication resources to be scanned per unit of time thereby increasing the likelihood of finding a relevant communication.

Incorporating the present method of scanning also provides a more efficient scanner that uses resource analysis to determine when priority samples can be made in a manor that does not disrupt a non-priority communication. The option of making these non-intrusive priority samples can be determined by comparing the known characteristics of the non-priority signal being received with the expected characteristics of a priority signal. If these two signal types are on the same channel and are not mutually exclusive, then it is possible to take a priority sample by attempting to detect characteristics of the priority signal in the received non-priority signal, which eliminates an undesirable audio hole and improves audio quality and intelligibility of a non-priority or lower priority signal.

The present method of scanning also provides a more efficient scanner that uses resource analysis to determine when priority samples are not necessary. The necessity of priority samples can be determined by comparing the known characteristics of the non-priority signal being received with the expected characteristics of a priority signal. If these two signal types are on the same channel and are mutually exclusive, then there is no need to take a priority sample, which eliminates an undesirable audio hole and improves audio quality and intelligibility of a non-priority or lower priority signal.

What is claimed is:

1. In a communication unit in which a priority scan occurs, wherein priority scan comprises automatically scanning, while the communication unit is unmuted to a non-priority communication resource having a first frequency, at least one priority communication resource having a second frequency, the method comprising the steps of:

receiving a signal on the non-priority communication resource;

unmuting the communication unit in response to the signal;

determining if the first frequency is substantially identical to the second frequency; and if the first frequency is substantially identical to the second frequency, inhibiting the priority scan.

2. The method of claim 1, further comprising the step of if the first frequency is different from the second frequency, continuing the priority scan.

3. The method of claim 1, wherein the step of determining further comprises the step of determining if the non-priority communication resource and the at least one priority communication resource have a common network identifier.

4. The method of claim 1, further comprising the steps of:

determining a first squelch rule assigned to the non-priority communication resource;

determining a second squelch rule assigned to the at least one priority communication resource;

comparing the first squelch rule to the second squelch rule;

if the first frequency is substantially identical to the second frequency, and if the second squelch rule is equally restrictive as or less restrictive than the first squelch rule, inhibiting the priority scan.

5. The method of claim 1, wherein the priority scan is performed from a scan list in which a plurality of channels is scanned in an order wherein all of the plurality of channels having a substantially identical frequency are scanned consecutively before a channel is scanned having a different frequency.

6. The method of claim 1, further comprising the step of waiting for an end of a scan interval before completing the determining and inhibiting steps.

7. The method of claim 1, wherein the inhibiting step further comprises the step of treating the signal as a priority signal.

8. In a communication unit in which a priority scan occurs, wherein priority scan comprises automatically scanning, while the communication unit is unmuted to a non-priority communication resource having a first frequency, at least one priority communication resource having a second frequency, a method comprising the steps of:

receiving a signal on the non-priority communication resource;

unmuting the communication unit;

determining if the first frequency is substantially identical to the second frequency;

determining a first talkgroup assigned to the non-priority communication resource;

determining a second talkgroup affiliated with the at least one priority communication resource; and if the first frequency is substantially identical to the second frequency, and the first talkgroup is identical to the second talkgroup, inhibiting the priority scan for as long as the signal lasts.

9. The method of claim 8, further comprising the steps of:

determining a first squelch rule assigned to the non-priority communication resource;

determining a second squelch rule assigned to the at least one priority communication resource;

comparing the first squelch rule to the second squelch rule; and if the first frequency is substantially identical to the second frequency, and the first talkgroup is different from the second talkgroup, and if the second squelch rule is equally restrictive as or less restrictive than the first squelch rule, treating the signal as a priority signal and inhibiting the priority scan.

10. The method of claim 8, further comprising the step of if the first frequency is different from the second frequency, continuing the priority scan.

11. The method of claim 8, wherein the step of determining further comprises the step of determining if the non-priority communication resource and the at least one priority communication resource have a common network identifier.

12. The method of claim 8, wherein the priority scan is performed from a scan list in which a plurality of channels is scanned in an order wherein all of the plurality of channels having a substantially identical frequency are scanned consecutively before a channel is scanned having a different frequency.

13. The method of claim 8, further comprising the step of waiting for an end of a scan interval before completing the determining and inhibiting steps.

14. The method of claim 8, wherein the inhibiting step further comprises the step of treating the signal as a priority signal.

15. In a communication unit in which a priority scan occurs, wherein priority scan comprises automatically scanning, while the communication unit is unmuted to a non-priority communication resource having a first frequency, at least one priority communication resource having a second frequency, a method comprising the steps of:

receiving a signal on the non-priority communication resource;

unmuting the communication unit;

determining if the first frequency is substantially identical to the second frequency;

determining a first squelch rule assigned to the non-priority communication resource;

determining a second squelch rule assigned to the at least one priority communication resource;

comparing the first squelch rule to the second squelch rule; and if the first frequency is substantially identical to the second frequency, and if the second squelch rule is equally restrictive as or less restrictive than the first squelch rule, inhibiting the priority scan.

16. The method of claim 15, further comprising the step of if the first frequency is different from the second frequency, continuing the priority scan.

17. The method of claim 15, wherein the step of determining further comprises the step of determining if the non-priority communication resource and the at least one priority communication resource have a common network identifier.

18. The method of claim 15, wherein the priority scan is performed from a scan list in which a plurality of channels is scanned in an order wherein all of the plurality of channels having a substantially identical frequency are scanned consecutively before a channel is scanned having a different frequency.

19. The method of claim 15, further comprising the step of waiting for an end of a scan interval before completing the determining, comparing, treating, and inhibiting steps.

20. The method of claim 15, wherein the inhibiting step further comprises the step of treating the signal as a priority signal.

* * * * *